(12) United States Patent
Luo et al.

(10) Patent No.: US 7,769,944 B2
(45) Date of Patent: Aug. 3, 2010

(54) PARTIAL-WRITE-COLLECTOR ALGORITHM FOR MULTI LEVEL CELL (MLC) FLASH

(75) Inventors: Jianjun Luo, Sunnyvale, CA (US); Chris Tsu, Saratoga, CA (US); Charles Chung Lee, Cupertino, CA (US); David Queichang Chow, San Jose, CA (US)

(73) Assignee: SuperTalent Electronics, Inc., San Jose, CA (US)

( * ) Notice: Subject to any disclaimer, the term of this patent is extended or adjusted under 35 U.S.C. 154(b) by 592 days.

(21) Appl. No.: 11/774,906

(22) Filed: Jul. 9, 2007

(65) Prior Publication Data

US 2008/0037321 A1 Feb. 14, 2008

Related U.S. Application Data

(63) Continuation-in-part of application No. 10/957,089, filed on Oct. 1, 2004, now abandoned.

(51) Int. Cl.
*G06F 12/00* (2006.01)
(52) U.S. Cl. ............................... 711/103; 711/203
(58) Field of Classification Search ............. 711/103, 711/203; 365/185.03
See application file for complete search history.

(56) References Cited

U.S. PATENT DOCUMENTS

| 7,407,393 | B2 | 8/2008 | Ni et al. | |
|---|---|---|---|---|
| 7,420,803 | B2 | 9/2008 | Hsueh et al. | |
| 2006/0087893 | A1* | 4/2006 | Nishihara et al. | 365/189.01 |
| 2006/0285397 | A1* | 12/2006 | Nishihara et al. | 365/185.33 |
| 2007/0230253 | A1* | 10/2007 | Kim | 365/185.29 |

\* cited by examiner

*Primary Examiner*—Vu A Le
(74) *Attorney, Agent, or Firm*—Maryam Imam; IPxLaw Group LLP

(57) ABSTRACT

A flash memory system includes a multi level cell (MLC) flash memory organized into blocks and having pages of information, which has data and spare. The MLC flash memory includes at least a temporary area to store at least a portion of a page of information during a partial write operation. The MLC flash memory stores a page of information into a block identified by a target physical address. The flash memory system further includes a flash card micro-controller causes communication between a host flash card controller and the MLC flash memory and includes a buffer memory configured to store a portion of a page of information, where the micro-controller writes the at least a portion of a page of information to the temporary area and later copies the written at least a portion of a page of information into the block identified by a target physical address.

20 Claims, 8 Drawing Sheets

Pointer = PWC Pointer

PARTIAL-WRITE-COLLECTOR ALGORITHM FOR MULTI LEVEL CELL (MLC) FLASH

CROSS REFERENCE TO RELATED APPLICATIONS

This application is a continuation-in part of U.S. application Ser. No. 10/957,089, entitled "Flash Card System", filed on Oct. 1, 2004, now abandoned by Lee et al., the contents of which are incorporated herein by reference as though set forth in full. This application is related to U.S. Pat. No. 7,082,056, entitled "Flash Memory Device and Architecture with Multi Level Cells", filed on Mar. 12, 2004 by Ben W. Chen et al., and issued on Jul. 25, 2006, the contents of which are incorporated herein by reference as though set forth in full.

BACKGROUND OF THE INVENTION

1. Field of the Invention

This invention relates to the field of digital systems employing non-volatile (or flash) memory and particularly multi level cell (MLC) flash.

2. Description of the Prior Art

Solid state memory or non-volatile memory, in the form of flash, is readily employed in numerous applications requiring saving and retrieving digital information. Some use thereof includes memory sticks, disk drives, personal digital assistants (PDAs) and other digital mobile devices.

NAND flash memory is a type of flash memory constructed from electrically-erasable programmable read-only memory (EEPROM) cells, which are an array of floating gate transistors. NAND refers to the type of gate used in the flash memory. NAND flash memory uses tunnel injection for write and tunnel release during erase operations. NAND flash, which is a type of non-volatile memory, is ideal for storage of digital information in portable devices.

However, NAND flash memory does have limitations. Namely, in flash, digital information or data is stored as binary information, i.e. '1' or '0'. One limitation posed by NAND flash memory is that during storage of data, which occurs during writing to or programming of the flash memory, data that is '1's can only be stored in the flash memory. Data that is '0's cannot be store until erase occurs of the previously-stored data. In fact, when writing from a state of '0' to a state of '1', the flash memory needs to be erased a "block" at a time, which is undesirable as it adversely affects performance by way of efficiency. The reason for the requirement for erasing a "block" at a time is that while the smallest unit for a read or program operation to NAND flash memory is a byte (eight bits) or a word, the smallest unit for erase is a block. A bit of information or data is represented by a '1' or '0'. A block refers to one or more pages of information made of bytes or words, and that which is erasable as a unit. An exemplary page size is 2 kilo (K) bytes of which may be reserved for data and 64 bytes of which are reserved for spare. The structure of a page can be either 4*512+64 bytes or 4*(512+16) bytes, the 512 bytes being used for data and the 16 bytes for address flag, error correction code (ECC) or other non-data information. The structure of a page may be other than the foregoing but essentially similar in the type of information included therein.

Single Level Cell (SLC) flash memory and Multi Level Cell (MLC) flash memory are two types of NAND flash memory. As the typical flash in the market, the erase block size of SLC flash is 128K+4K bytes and the erase block size of MLC flash is 256K+8K bytes. Thus, erase operations severe impact performance, particularly, when performed on large capacity memory. Another limitation of NAND flash memory has a finite numbers of times of erase cycles before it becomes unreliable. The number of erase operations that may be performed on NAND flash memory reliably is known to be limited to 10,000 to 1,000,000.

A comparison of MLC flash memory with SLC flash memory yields certain advantages and disadvantages by the former when used in consumer applications. The SLC flash memory, being memory cell-based, is capable of storing a single bit of data or information per cell whereas, MLC flash memory is capable of storing two bits of data per cell. Therefore, MLC flash memory has associate therewith twice the memory capacity of SLC flash memory assuming the same technology is used for manufacturing both. Moreover, the performance, reliability and durability costs of the MLC flash memory are higher. Thus, MLC flash memory being lower in cost and with greater memory capacity is desirably employed in consumer products. However, MLC flash memory is also known to have lower write speed than SLC flash memory thereby requiring a longer time to store information, such as digital pictures, therein. In a camera application, for example, this significantly impacts the photographers ability to take multiple shots fast.

A block of MLC flash memory includes M pages, M being an integer number with each page being N bytes, with N being an integer value. Fragment, as known in the computer industry, is created easily when the host sequentially sends less N bytes of data because MLC flash memory cannot be re-programmed, thus, the part of the N bytes that is not used to store data is wasted space leading to fragmentation or different parts of user files being located in different areas of memory.

Additionally, the life time of the MLC flash memory is limited to 10,000 erase cycles or operations. An entire block must be erased in MLC flash memory before a page can be re-programmed. Therefore, wear leveling techniques are needed to address the MLC flash re-programming problem.

Wear leveling is a technique used to distribute use of the memory cells within the MLC flash memory evenly thereby extending the lifetime of the latter. In wear leveling, a memory controller is used to re-map logical addresses, used to by a host to address memory, to different physical addresses, used to address the MLC flash memory, so that write operations are evenly distributed among the memory cells to extend the endurance of the MLC flash memory.

There is therefore a need for an MLC flash memory with higher performance by way of faster write operations thereto, less fragmentation and improved reliability.

SUMMARY OF THE INVENTION

Briefly, an embodiment of the present invention includes a flash memory system includes a multi level cell (MLC) flash memory organized into blocks and having pages of information, which has data and spare. The MLC flash memory includes at least a temporary area to store at least a portion of a page of information during a partial write operation. The MLC flash memory stores a page of information into a block identified by a target physical address. The flash memory system further includes a flash card micro-controller causes communication between a host flash card controller and the MLC flash memory and includes a buffer memory configured to store a portion of a page of information, where the micro-controller writes the at least a portion of a page of information to the temporary area and later copies the written at least a portion of a page of information into the block identified by a target physical address.

The foregoing and other objects, features and advantages of the invention will be apparent from the following detailed description of the preferred embodiments which made reference to the several figures of the drawing.

IN THE DRAWING

Figure 3:
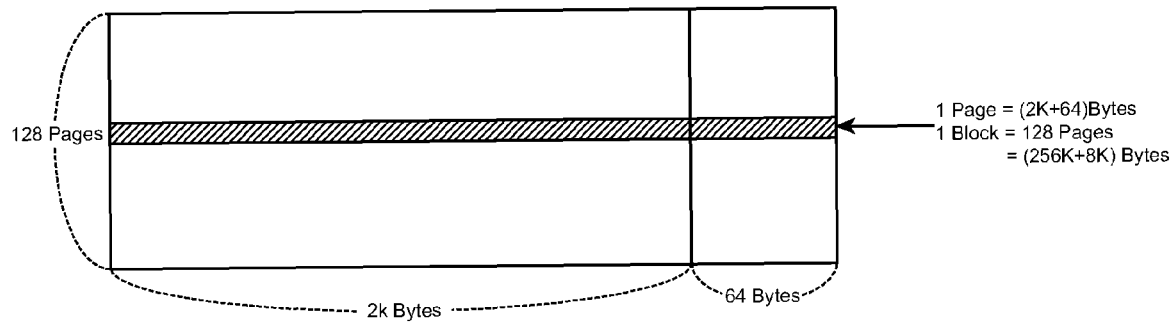
FIG. 3 shows an example of a block including 128 pages with each page having 2K bytes of data area and 64 bytes of spare area.
Figure 3A:
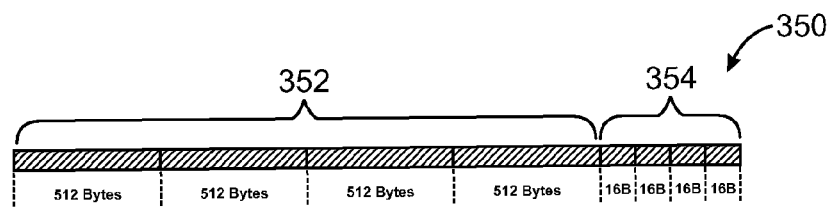
Figure 3B:
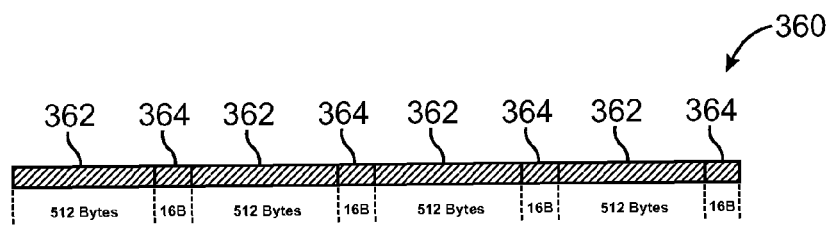

FIGS. 3(a) and 3(b) show different structures, as examples, of a page of FIG. 3.

Figure 2:
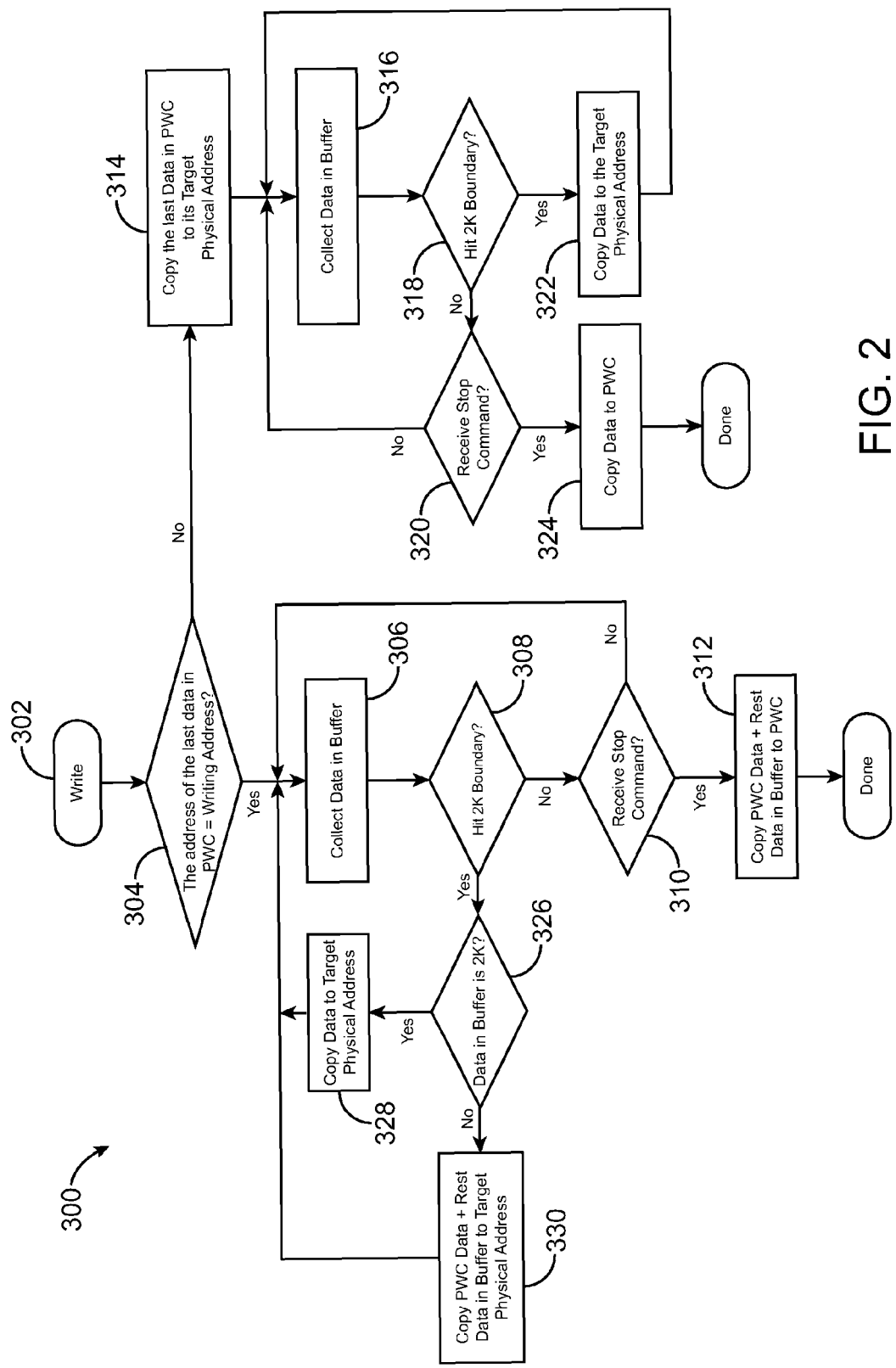
FIG. 2 shows a flow chart of the steps performed by the flash memory system, in accordance with a method of the present invention.

FIGS. 4-8 show examples of the contents of various memory corresponding the various steps shown in FIG. 2.

DETAILED DESCRIPTION OF THE PREFERRED EMBODIMENTS

In an embodiment of the present invention, during a partial write operation to MLC flash memory, a temporary storage location, a partial write collector (PWC), of at least one block in size, is used to store data that is to be written during the write operation, serving basically as a basket of information, and later when the write operation resumes, the temporarily stored data is retrieved and written thereby ensuring successful writing of data during the write operation. The temporary storage location includes, at least, the last page that is to be or was written. Otherwise, when data is being written not in a partial write operation manner, it is written to a more permanent location within the MLC flash memory. The PWC can be used in a wear leveling method to enhance reliability and performance of the MLC flash memory.

For a more detailed discussion of an exemplary MLC flash memory which can be used with the various embodiments and methods of the present invention, the reader is directed to U.S. Pat. No. 7,082,056, entitled "Flash Memory Device and Architecture With Multi Level Cells", by Ben W. Chen et al., and issued on Jul. 25, 2006, which is herein incorporated by reference as though set forth in full.

Figure 1:
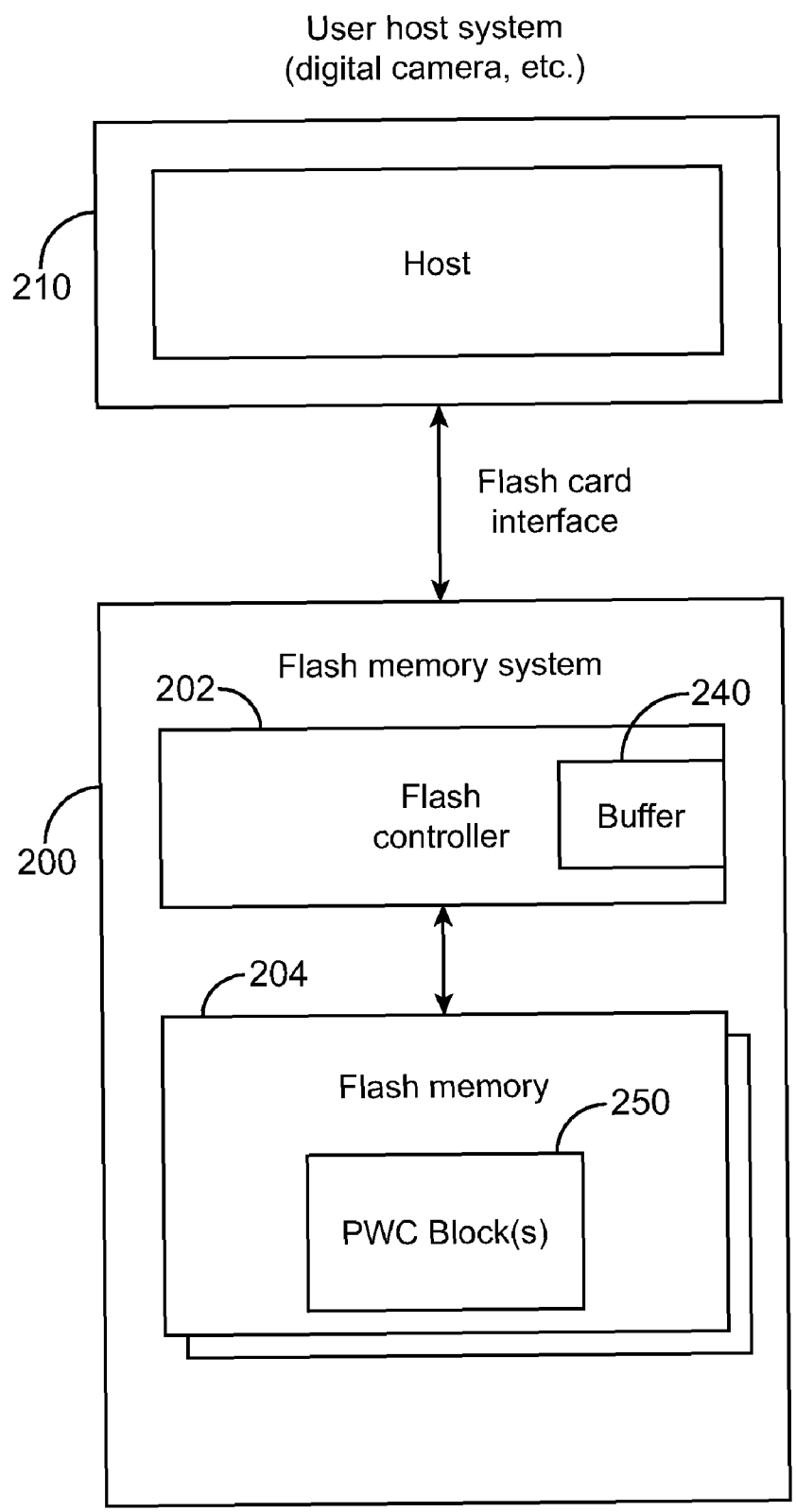
FIG. 1 shows a flash (or non-volatile) memory system in accordance with an embodiment of the present invention.

Referring now to FIG. 1, a flash (or non-volatile) memory system 200, which may be a part of a computer (personal computer (PC)), digital camera and the like is shown in accordance with an embodiment of the present invention, is shown to include a flash controller 202 and a flash memory 204. The flash memory 204 includes MLC flash memory, either in the form of an array or otherwise, for storing digital information and is organized into blocks of pages and is programmed or written thereto using the various techniques to be discussed shortly in accordance with the teachings of the present invention. The term flash memory represents one or more flash memory devices. The flash memory system 200 is shown coupled to a host 210, which is shown to include a flash controller 202. The flash memory system 200 may be implemented as a printed circuit board (PCB) or flash card. The flash memory system 200 can store various types of data including image data and other types of multimedia data. Accordingly, the flash memory system 200 can also be referred to as a multimedia card (MMC). The flash memory 204 is shown to include a PWC block 250 for temporary storage of information including data and spare being written by the user host 210.

In the case where the flash memory 204 is MLC flash memory, being large in size, such as 2 kilo (K) bytes, are written to the memory. In the case where a partial write of a page is being conducted, that is, a portion of a page is written and then the writing stops and the remaining portion is to be written, the write operation is performed inefficiently using current systems and techniques. However, in the embodiment(s) of the present invention, partial write to a page followed by writing of the remainder of the page is advantageously efficiently performed.

FIG. 2 shows a flow chart 300 of the steps performed by the flash memory system 200 of FIG. 1 in performing a write operation to the MLC flash memory within the flash memory 204 as a partial or full write.

In FIG. 2, at step 302, the write operation begins, next, at step 304, a determination is made as to whether or not the address of the last data in a partial write collector (PWC) block is the same as the address to be written thereto. The PWC block is one or more blocks of memory within the flash memory 204 used as a temporary location within which information to be written during a write operation is stored in the case where the write operation is a partial write operation. The address to which information is to be written is initially provided by the flash controller 202 through the flash card interface, shown in FIG. 1.

Upon a determination that the address to which information is to be written during the write operation matches that of the PWC block, the flow of FIG. 2, continues to step 306 where data to be written is collected or stored in the buffer 240. Next, at 308, a determination is made as to whether or not a page worth of data has been collected. In the case where a page is 2K bytes, a 2K byte boundary is checked. If it is determined, at 308, that a page boundary is encountered, the process continues to 310 where a determination is made as to whether or not a "STOP" command has been received from the flash controller 202.

Figure 8:
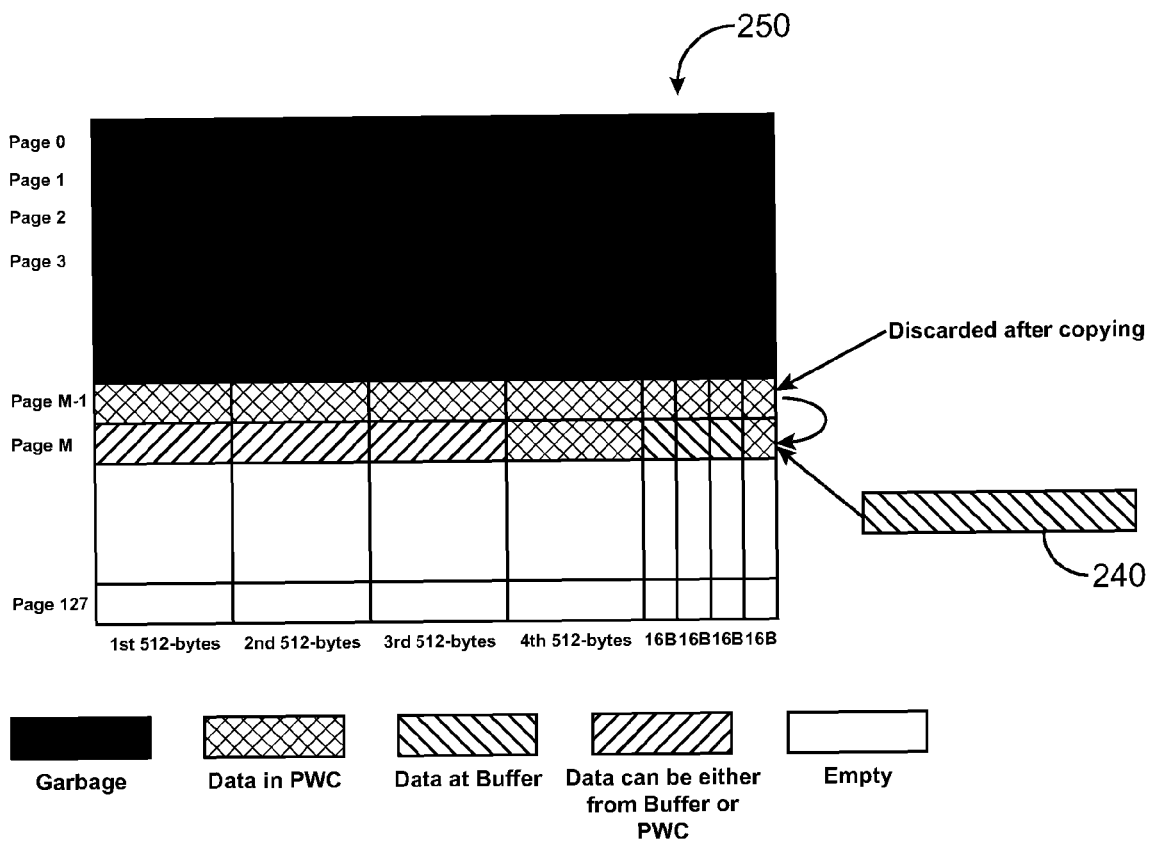

If at 310, it is determined that the a "STOP" command has been received by the flash memory system 200, step 312 is performed where a copy of the data stored in the PWC block as well as the data saved in the buffer memory 240 are stored in the PWC block, an example of which is shown in FIG. 8 and will be discussed further relative to the latter. The foregoing essentially serves to save the data that is being written by the host, in a continuous or sequential form, in the PWC block.

In the event, at 304, in FIG. 2, it is determined that the address of the last data in the PWC block does not match the address of the location to which data is being written during this write operation, the process continues to step 314 where the most recent or last data written in the PWC is copied to its target destination at a location identified by a target physical address. One way to reach the step 314 is by having started a write operation and then having had to stop it, i.e. partial write operation, and then are now resuming it, which would lead to the address of the last data stored in the PWC block not being that of the address of the information being written. During a write operation, data or information to be written to flash memory is collected in the buffer 240. In the where a partial write operation is being performed, data is also collected in the PWC block.

Figure 4:
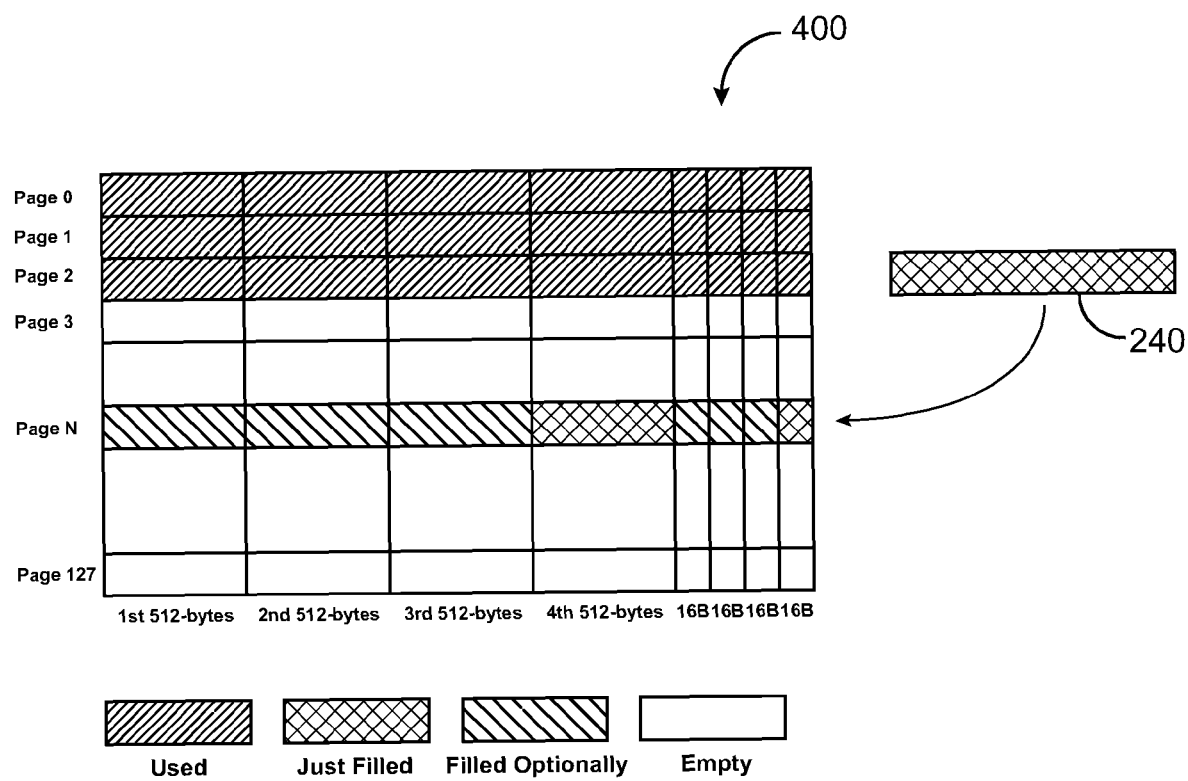

Next, at step 316, the data being written by the host is collected in the buffer memory 240 followed by a determination of a page boundary at 318. If at 318, it is determined that a page boundary is hit, the process continues to step 322 where data that is being written is, in its entirety, written to its target destination identified by the target physical address, as shown in FIG. 4. In the case where the process gets to step 322, no partial write may have occurred in which case the write operation was contiguous during the writing of the entire page.

Figure 5:
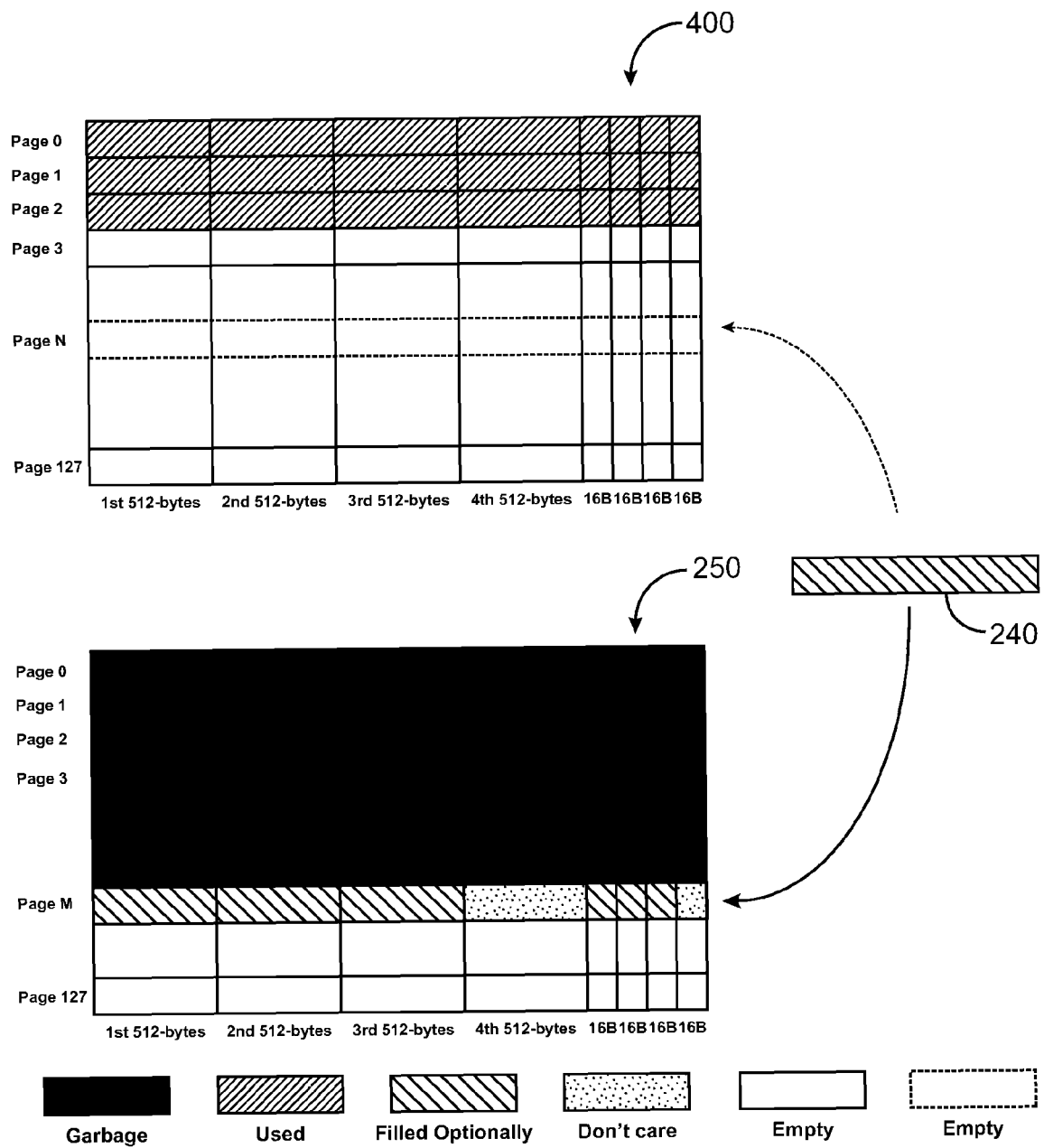

If at 318, it is determined that a page boundary has not been encountered, then, the process continues to 320 where a determination is made as to whether or not a "STOP" command is received from the host and if not, the process continues to step 316, otherwise, the process goes on to step 324 where data to be written by the host is copied or stored in the PWC block, as shown in FIG. 5.

Figure 6:
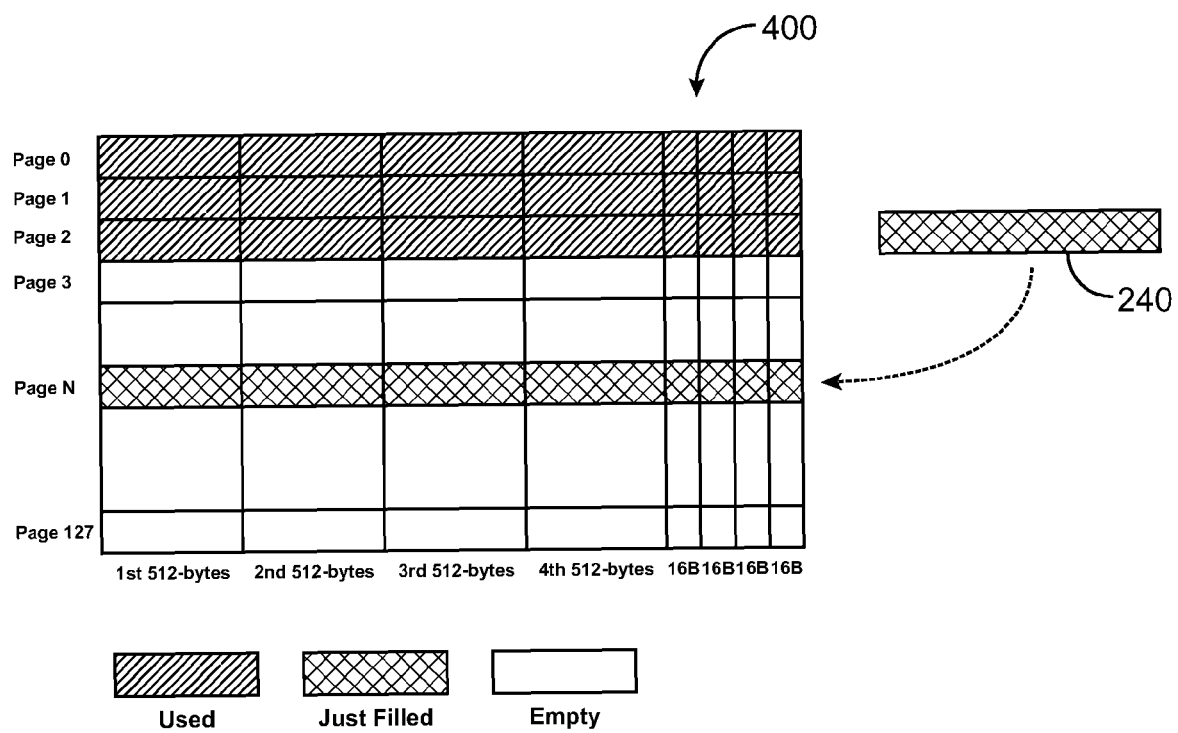

If at 308, it is determined that a page boundary is encountered, the process continues to 326 where a determination is made as to whether or not the data in the buffer memory 240 is a page in size, such as 2K bytes and if so, the process goes on to step 328 where information from the buffer memory 240, written thereto by the host, is copied (or moved), in its entirety, to a target destination, identified by a target physical address, such as shown in FIG. 6. In the foregoing case, no partial write is performed because a page boundary is hit and the data buffer is filled with the entire page of information. The target destination in cases in FIG. 2 is in the flash memory 204 as that is where the host intends to store information, as previously discussed.

Figure 7:
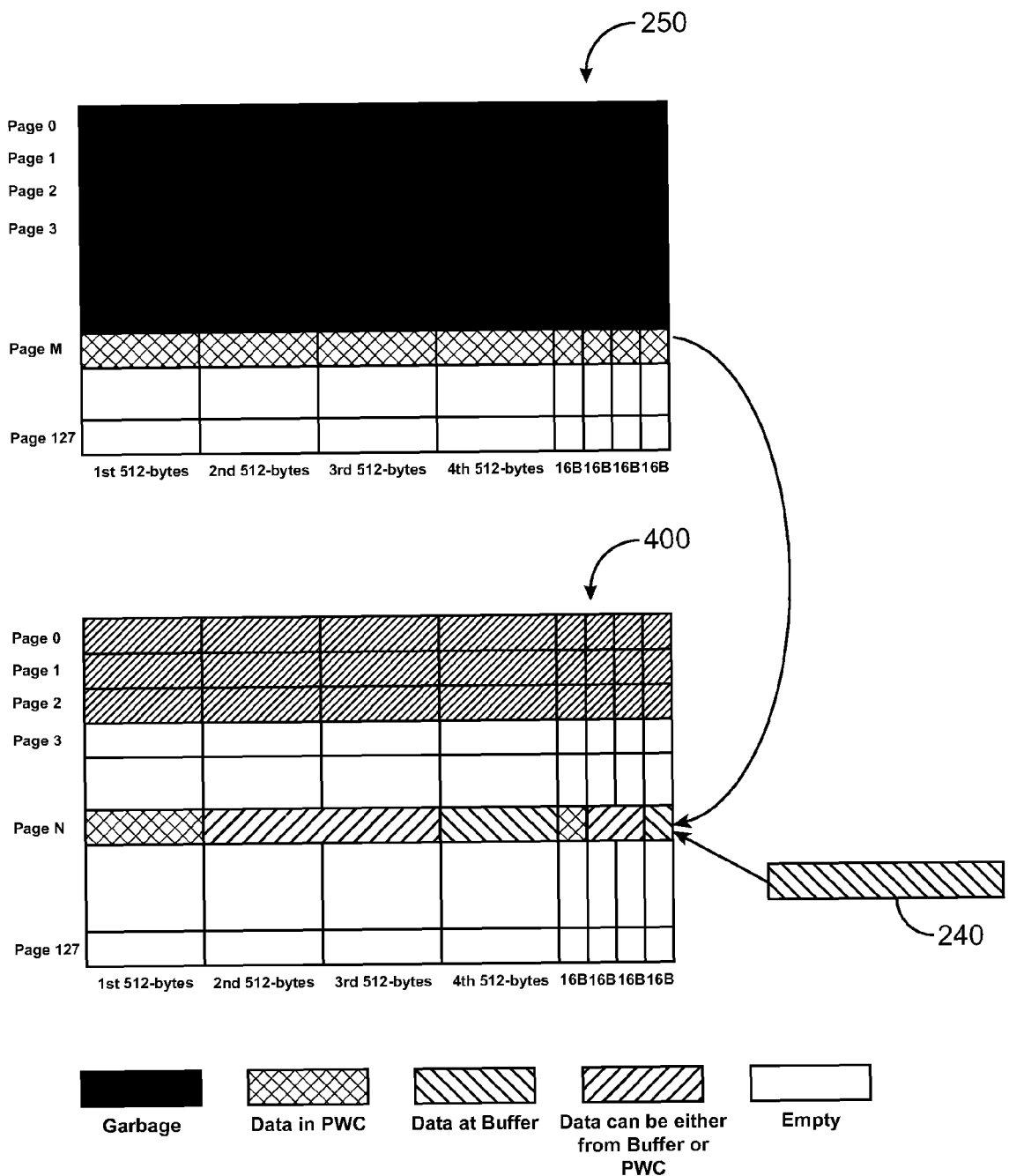

If at 326, it is determined that the information stored in the buffer memory 240 is not a page in size (or 2K bytes for example), a partial write has occurred (otherwise, the buffer memory would be full) and the process continues to step 330 where the current information stored in the PWC block 250 is copied along with the current information in the buffer memory 240 to the target destination, as identified by a target physical address and shown in FIG. 7. Current information refers to information, from the host, that has not yet been written or stored but need be stored and it is valid information as opposed to old or not current or defective information. Current or old information is identified by flags in the spare area. After step 330, the process returns and continues at step 306.

FIG. 3 shows an example of a block including 128 pages with each page having 2K bytes of data area and 64 bytes of spare area. FIGS. 3(a) and 3(b) show different structures, as examples, of a page of FIG. 3. The pages of the block are written thereto by the host in accordance with the embodiments and methods of the present invention. In FIG. 3(a), a page is shown to include 4*512 bytes of data in a data area 352 and 4*16 bytes of spare in a spare area 354. Each of the 512 bytes of data has a corresponding 16 byte spare located in the spare area 354. Each 512 bytes of data and its corresponding spare are at times referred to as sector. Thus, in FIG. 3(a), the four 512 bytes of data are sequentially located or located adjacent to each other and each of their corresponding spares are located after the data area 352 but also in sequential order.

In FIG. 3(b), a page 360 is shown to include 4*(512 bytes+ 16 bytes) where each of the 512 bytes of data 362 are of data in a data area 352 and 4*16 bytes of spare in a spare area 354. Each of the 512 bytes of data has a corresponding 16 byte spare located in the spare area 354. Each 512 bytes of data 362 and its corresponding spare 364 are at times referred to as sector. In FIG. 3(b) each of the data 362 and corresponding spare 364 are shown adjacent to each other and adjacent to the data-spare pair is located the next 512 bytes of data 364 and its corresponding spare 364.

FIGS. 4-8 show examples of the contents of various memories corresponding to the various steps shown in FIG. 2. For example, FIG. 4 shows a target physical address block 400, which is included in the flash memory 204 of FIG. 1, and further show the buffer memory 240. The block 400 is the block within which the information being provided by the host is to be written. The block 400 is shown to include 128 pages in the embodiment of FIG. 4, however, other number of pages may be included in the block 400. One of the ways the status of the block 400 and the buffer memory 240 are as shown in FIG. 4, is by performance of the steps, 316, and 322 in FIG. 2. As noted earlier, the block 400 includes 128 pages including a page N, which is where the information from the buffer memory 240 is copied thereto. The information stored in the buffer memory 240 is information collected at step 316 in FIG. 2 and its data appears at the fourth 512 byte data area of page N and its spare appears at the last spare area of page N. The information stored in the first three 512 bytes of the data area of page N, in FIG. 4, and the first three 16 bytes of spare areas of page N are filled with 0xFF. The target address here refers to the address within the spare (or flag within the spare) of the corresponding page. The target address at step 314 is the address of the information stored within the PWC block. The target address at step 322 is the address of the information stored in the buffer 240. Thus, the target address at step 314 is different than the target address at step 322. The first three 512 bytes of the data of the four sections of the page N are either empty (filled with 0xFF) or filled with data from the buffer 240.

In FIGS. 4-8 different shadings of the pages indicate the status of the information. For example, in FIG. 5, the dark shading in Target Physical Address Block 400 indicates "current" or "used" or "old" information that can be valid or current. The dark shading in Partial Write Collector Block 250 indicates 'used' or 'old' or 'garbage' information, i.e. information that is no longer valid or current. Blank or white areas indicate no information or empty. The darker checkered areas indicate information that is current and just stored in the page N (from the buffer memory 240) and the lighter checkered shading indicates optionally filled. In FIG. 4, essentially, the page boundary was encountered and the current information is present in the buffer 240, thus, some of the page N information comes from the buffer memory and some information is filled with 0xFF, as shown by the shadings. Indication of current information within the PWC block 250 is through the flags located in the corresponding spare area of a 512 byte data area.

FIG. 5 shows a target physical address block 400, which is included in the flash memory 204 of FIG. 1, and further show the buffer memory 240 and the PWC block 250. The block 400 is the block within which the information being provided by the host is to be written. The blocks 400 and 250 are each shown to include 128 pages in the embodiment of FIG. 5, however, other number of pages may be included therein. One of the ways the status of the block 400 and the buffer memory 240 and the block 250 are as shown in FIG. 5, is by performance of the step 324. That is, a "STOP" command has been received by the flash memory system 200, yet an entire page has not yet been written, as commanded by the host, thus, during the stop period, the information already written by the host, which now resides in the data buffer memory 240, is written or copied to the page M of the block 250. Since, so far, only some of the first three 512 byte data and their respective spares have been written by the host, only they are copied to corresponding locations in page M in the block 250. The status of the page M in the block 250 may be any of the following: The first, second and third 512-byte sections of data of the page are filled with data from the buffer 240 and the fourth 512-byte data is don't care or it does not matter what it is; The first and second or second and third 512-byte sections of data of a page are filled with data and it does not matter what the remaining 512-byte sections of the page include; The first, second or third 512-byte sections of data of a page are filled with data and it does not matter what the remaining 512-byte sections of the page include; or The status of the 16-byte spare of the four sections of a page match the status of their corresponding data.

FIG. 6 shows a target physical address block 400, which is included in the flash memory 204 of FIG. 1, and further shows the buffer memory 240. The block 400 is the block within which the information being provided by the host is to be written. The block 400 is shown to include 128 pages in the embodiment of FIG. 4, however, other number of pages may be included in the block 400. One of the ways the status of the block 400 and the buffer memory 240 are as shown in FIG. 6, is by performance of the step 330. In the example of FIG. 6, as no partial write occurs, the information stored in the buffer memory 240, which is an entire page of information, is copied to the block 400.

FIG. 7 shows a target physical address block 400, which is included in the flash memory 204 of FIG. 1, and further show the buffer memory 240 and the PWC block 250. The block 400 is the block within which the information being provided by the host is to be written. The blocks 400 and 250 are each shown to include 128 pages in the embodiment of FIG. 5, however, other number of pages may be included therein. One of the ways the status of the block 400 and the buffer memory 240 and the block 250 are as shown in FIG. 7, is by performance of the step 330, in FIG. 2. Pages 0-(M-1) of the block 250 include garbage or old information, whereas, page M thereof includes current information, as denoted by respective flags of the 512 bytes of data in their spare. Since hit the 2K boundary, the $4^{th}$ 512 bytes information must come from the buffer memory. Since a page of information was not stored in its entirety in the buffer memory 240, the first 512 bytes information must come from the PWC 250. The remainder comes either from the block 250 or form the buffer memory 240. It should be noted that in FIGS. 4-8, spare corresponding to a 512 byte data is stored accordingly although in alternative embodiments, spare corresponding to a 512 byte data can be stored in an area that does not readily show such correspondence in which case additional information is required to correlate a spare to its data.

FIG. 8 shows a target physical address block 400, which is included in the flash memory 204 of FIG. 1, and further shows the buffer memory 240. The block 400 is the block within which the information being provided by the host is to be written. The block 400 is shown to include 128 pages in the embodiment of FIG. 4, however, other number of pages may be included in the block 400. One of the ways the status of the block 400 and the buffer memory 240 are as shown in FIG. 8, is by performance of the step 312. In this case, information from page M-1 of the block 250 is copied to page M thereof but only as to information that was not collected in the buffer memory 240, and as a page boundary was not encountered, therefore a page worth of information was not stored in the buffer memory 240, the remainder of the page information comes either from the buffer memory 240, to the extent it was collected or from the block 250.

The block 250 may include more than one block of information.

Although the present invention has been described in terms of specific embodiments it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A flash memory system comprising:
an multi level cell (MLC) flash memory organized into blocks having pages of information, a page of information including data and spare, the MLC flash memory including at least a partial write collector (PWC) block adapted to temporarily store at least a portion of a page of information during a partial write operation, the MLC flash memory configured to store a page of information into a block identified by a target physical address; and
a flash controller coupled to cause communication between a host flash card controller and the MLC flash memory and including a buffer configured to store a portion of a page of information,
wherein the controller writes the at least a portion of a page of information to the PWC block and later copies the written at least a portion of a page of information into the block identified by a target physical address.

2. A flash memory system, as recited in claim 1, wherein the controller is adapted to copy the portion of a page of information stored in the buffer to the block identified by a target physical address.

3. A flash memory system, as recited in claim 1, wherein the spare includes a flag indicative of the status of the block in which the spare is included.

4. A flash memory system, as recited in claim 1, wherein each page of information includes four sections of data and spare.

5. A flash memory system, as recited in claim 4, wherein the data in each section of the four sections includes 512 bytes.

6. A flash memory system, as recited in claim 5, wherein the spare in each section of the four sections includes 16 bytes.

7. A flash memory system, as recited in claim 4, wherein the data of the four sections are stored adjacent to each other within the corresponding page of information and the spare of each section is stored adjacent to each other within the corresponding page of information.

8. A flash memory system, as recited in claim 4, wherein the data of the four sections and the spare of the four sections are stored in a manner where they are interleaved within a page of information, wherein the spare of a first section being stored adjacent to the data of the first section and the spare of the second section being stored adjacent to the data of the second section and so on.

9. A method of performing partial write operation comprising:
determining if the address of a last page of information written to a partial write collector (PWC) block matches the address to which the page of information is to be written;
if it is determined that the address of last page of information written to the PWC block matches the address to which the page of information is to be written, collecting information previously stored in a buffer in the PWC block;
determining if a page boundary has been encountered; and
if it is determined that the page boundary has not been encountered, copying the portion of the page of information collected in the PWC block and any remaining portion of the page of information in the buffer to the PWC block.

10. A method of performing partial write operation, as recited in claim 9, wherein if it is determined that the page boundary has been encountered, determining if the portion of the page of information stored in the buffer is a page size of information.

11. A method of performing partial write operation, as recited in claim 10, if it is determined that the portion of the page of information stored in the buffer is a page size of information, copying the page of information collected in the PWC block to a block in flash memory identified by a target physical address.

12. A method of performing partial write operation, as recited in claim 10, if it is determined that the portion of the page of information stored in the buffer is not a page size of information, copying a portion of the page of information collected in the PWC block and a portion of the page of information remaining in the buffer into a block in flash memory identified by a target physical address.

13. A method of performing partial write operation, as recited in claim 9, wherein if it is determined that the address of a last page of information written to a partial write collector (PWC) block does not match the address to which the page of information is to be written, copying the last page of information previously stored in the PWC block to a block, within the flash memory, identifiable by a target physical address.

14. A method of performing partial write operation, as recited in claim 13, further including the step of collecting the page of information in the buffer and determining if a page boundary has been encountered.

15. A method of performing partial write operation, as recited in claim 14, further including the step of collecting the page of information in the buffer and determining if a page boundary has been encountered.

16. A method of performing partial write operation, as recited in claim 15, wherein if it is determined that a page boundary has been encountered, copying the page of information into a block in the flash memory identifiable by a physical address.

17. A method of performing partial write operation, as recited in claim 16, wherein if it is determined that a page boundary has not been encountered, determining if a 'stop' command has been received and if so, copying the page of information to the PWC block.

18. A method of performing partial write operation, as recited in claim 17, wherein if it is determined that a page boundary has been encountered, if it is determined that a 'stop' command has not been received, continuing to collect the page of information in the buffer.

19. A method of performing partial write operation, as recited in claim 16, wherein if it is determined that a page boundary has been encountered, copying the page of information into a block within the flash memory identifiable by a target physical address and continuing to collect additional page of information in the buffer.

20. A method of performing partial write operation, as recited in claim 19, further including the step of continuing to collect additional page of information in the buffer.

* * * * *